US010170839B2

(12) United States Patent
Xue et al.

(10) Patent No.: US 10,170,839 B2
(45) Date of Patent: Jan. 1, 2019

(54) CIRCULARLY POLARIZED PLANAR APERTURE ANTENNA WITH HIGH GAIN AND WIDE BANDWIDTH FOR MILLIMETER-WAVE APPLICATION

(71) Applicant: City University of Hong Kong, Kowloon (HK)

(72) Inventors: Quan Xue, New Territories (HK); Shaowei Liao, New Territories (HK); Dia'aaldin J. Bisharat, Kennedy Town (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 179 days.

(21) Appl. No.: 15/155,702

(22) Filed: May 16, 2016

(65) Prior Publication Data
US 2017/0331193 A1     Nov. 16, 2017

(51) Int. Cl.
*H01Q 1/38*     (2006.01)
*H01Q 9/04*     (2006.01)

(52) U.S. Cl.
CPC ......... *H01Q 9/0428* (2013.01); *H01Q 9/0457* (2013.01)

(58) Field of Classification Search
CPC ....... H01Q 1/38; H01Q 9/0428; H01Q 9/0457
See application file for complete search history.

(56) References Cited

U.S. PATENT DOCUMENTS

| | | | | |
|---|---|---|---|---|
| 4,197,544 A * | 4/1980 | Kaloi | ....................... | H01Q 1/48 343/700 MS |
| 8,912,970 B1 * | 12/2014 | Manry, Jr. | .............. | H01Q 13/18 343/700 MS |
| 2001/0050638 A1 * | 12/2001 | Ishitobi | .................... | H01Q 1/38 343/700 MS |
| 2006/0139223 A1 * | 6/2006 | Li | ........................ | H01Q 1/1271 343/713 |
| 2011/0227793 A1 * | 9/2011 | Johnson | ................. | H01Q 21/20 343/700 MS |
| 2012/0212376 A1 * | 8/2012 | Jan | ....................... | H01Q 9/0414 343/700 MS |

(Continued)

OTHER PUBLICATIONS

Liao, et al., "Differentially fed planar aperture antenna with high gain and wide bandwidth for millimeter-wave application," IEEE Trans. Antennas Propag., vol. 63, No. 3, pp. 966-977, Mar. 2015.

(Continued)

*Primary Examiner* — Dieu H Duong
(74) *Attorney, Agent, or Firm* — Amin, Turocy & Watson, LLP

(57) ABSTRACT

An antenna (e.g., circularly polarized (CP) planar aperture antenna) is presented herein. An antenna can include an opening cavity and a patch section within a perimeter of the opening cavity. The patch section can have crossed patch in a windmill shape. The opening cavity can have a windmill shape. The patch section can be fed differentially via grounded co-planar waveguide (GCPW). The antenna can be formed in a single layer substrate and can be 180° rotationally symmetric about its center. A height of the opening cavity can be quarter-wavelength at operating frequency and a diameter of the opening cavity can be larger than one wavelength at operating frequency.

23 Claims, 18 Drawing Sheets

(56) References Cited

U.S. PATENT DOCUMENTS

2016/0240925 A1* 8/2016 Xue ................... H01Q 9/0407

OTHER PUBLICATIONS

Pan, et al., "A 60-GHz CPW-fed high-gain and broadband integrated horn antenna." IEEE Trans. Antennas Propag., vol. 57, No. 4, pp. 1050-1056, Apr. 2009.

Ghassemi, et al., "Millimeter-wave integrated pyramidal horn antenna made of multilayer printed circuit board (PCB) process." IEEE Trans. Antennas Propag., vol. 60, No. 9, pp. 4432-4435, Sep. 2012.

Elboushi, et al., "High-Gain Hybrid Microstrip/Conical Horn Antenna for MMW Applications." IEEE Antennas Wireless Propag. Lett. ,vol. 11, pp. 129-132, 2012.

Enayati, et al., "Millimeter-Wave Horn-Type Antenna-in-Package Solution Fabricated in a Teflon-Based Multilayer PCB Technology." IEEE Trans. Antennas Propag., vol. 61, No. 4, pp. 1581-1590, Apr. 2013.

Miura, et al., "A high-efficiency circularly-polarized aperture array antenna with a corporate-feed circuit in the 60GHz band," IEICE Trans. Electron., vol. 94, No. 10, pp. 1618-1625, Oct. 2011.

* cited by examiner (0°)

(90°)

(180°)

(270°)

CIRCULARLY POLARIZED PLANAR APERTURE ANTENNA WITH HIGH GAIN AND WIDE BANDWIDTH FOR MILLIMETER-WAVE APPLICATION

TECHNICAL FIELD

The subject disclosure generally relates to a circularly polarized planar aperture antenna with high gain and wide bandwidth for millimeter-wave application.

BACKGROUND

Conventional antenna technologies including aperture antennas, such as horn and parabolic reflector antennas, are often employed for antenna applications (e.g., millimeter-wave antenna applications, etc.) due to their high gain, wide bandwidth and relatively simple structure. However, such technologies have had some drawbacks, some of which may be noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1:
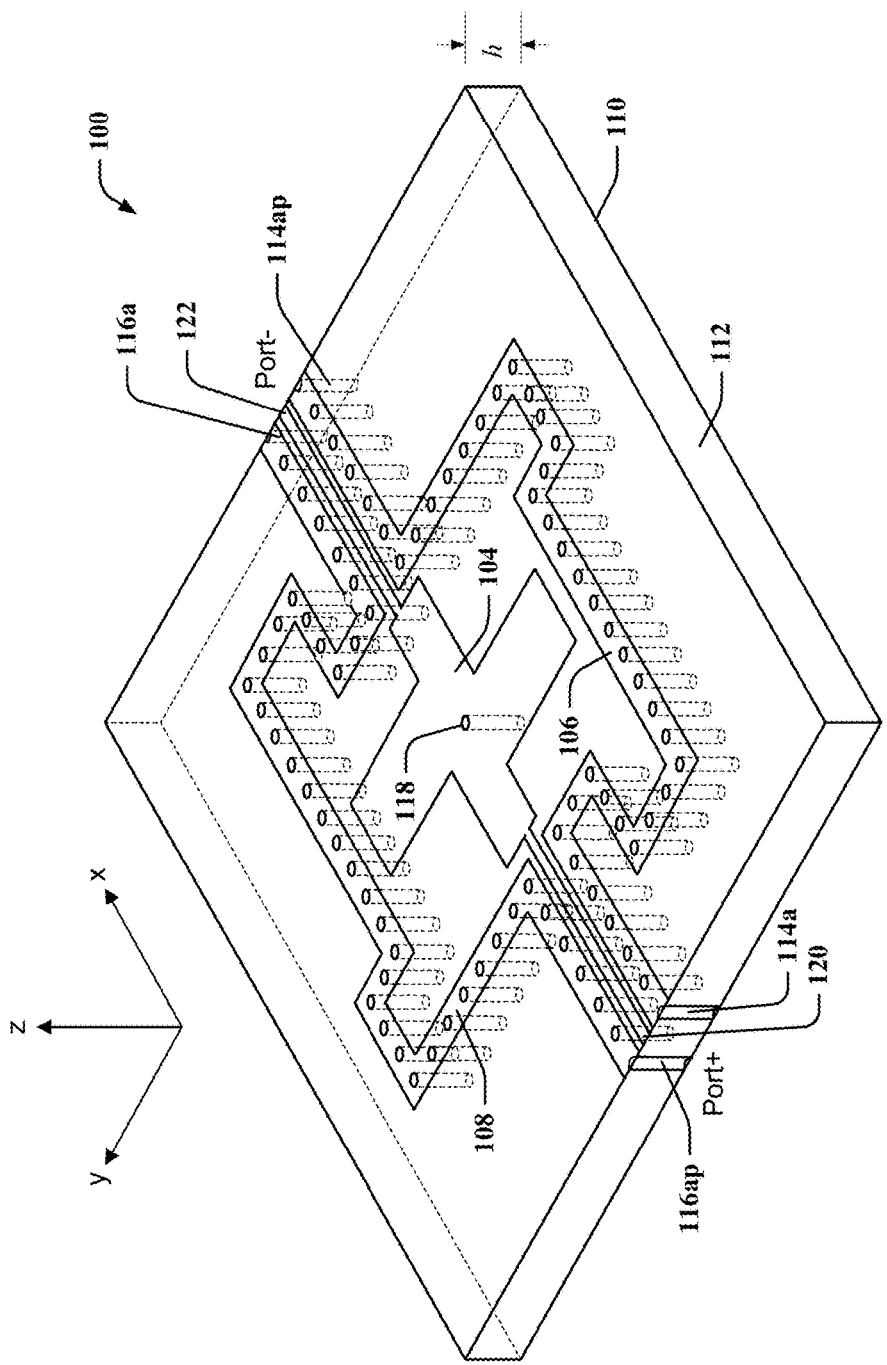
FIG. 1 illustrates a perspective view of an exemplary antenna in accordance with one or more embodiments described herein.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Conventional antenna technologies (e.g., conventional aperture antennas, such as horn, parabolic reflector antennas, etc.) have some drawbacks with respect to certain antenna applications (e.g., millimeter-wave antenna applications, etc.). For example, these conventional aperture antennas have a high profile, a large size, and a high cost, and thus are not suitable for various consumer level applications. Furthermore, recently proposed aperture antennas, including horn-like antennas that have planar form using various planar circuit processing technologies, are linearly polarized. This linear polarization can hinder antenna performance in practical applications, such as where there is misalignment between transmitter and receiver antennas, or there is significant loss due to multipath interferences.

To these and/or related ends, various embodiments disclosed herein provide for an improved antenna (e.g., a circularly polarized (CP) planar aperture antenna) that can be employed in, for example, millimeter-wave antenna applications. In an aspect, an antenna (e.g., a circularly polarized (CP) planar aperture antenna) can include a patch section and opening cavity section. The patch section and the opening cavity section can be integrated in a single-layered substrate (e.g. laminate) using standard printed-circuit-board (PCB) technology. The patch section can be configured as a crossed-patch, for example having a windmill-shaped. In one example, the patch section can be formed on (e.g., printed on, etc.) a top surface of a dielectric substrate. The opening cavity section can be configured as two sets of metallic pins, where each set of pins surrounds one half of the patch section on opposite sides. Each set of metallic pins can be configured as a vertical shorted patch conductively coupled at the top surface of the dielectric substrate. The opening cavity section can surround the patch section and be shaped, for example in a windmill shape. The antenna (e.g., a circularly polarized (CP) planar aperture antenna) can be excited by a differential feed to the patch section, for example using grounded co-planar waveguide (GCPW). GCPW has an advantage of providing a low radiation loss characteristic. However, the patch section can be fed differentially using other techniques, such as microstrip line and waveguide. Employing differential feeding eliminates the need for bulky off-chip and lossy on-chip baluns when integrating the antenna (e.g., a circularly polarized (CP) planar aperture antenna) with differential millimeter-wave (mmWave) monolithic integrated circuits, and offers high polarization purity.

As such, an antenna (e.g., a circularly polarized (CP) planar aperture antenna) with a low cost, low profile, easy integration with common differential monolithic circuits, and improved electrical characteristics (e.g., circularly polarized radiation, wide axial ratio, wide impedance bandwidth, symmetrical and/or stable radiation patterns at different frequencies over an operating bandwidth, low back radiation, low cross polarization, high and/or stable gain, etc.) can be provided. The antenna (e.g., the circularly polarized (CP) planar aperture antenna) can also be associated with a simple radiating and feeding structure (e.g., an improved feeding technique), a low profile, a light weight design and/or a wide operating bandwidth. Therefore, the antenna (e.g., the a circularly polarized (CP) planar aperture antenna) can be less difficult to fabricate and/or can be suitable for employment in consumer level millimeter-wave products, such as in a non-limiting example, seamless wireless displays, wireless docking, streaming of high definition media and backup synchronization, which usually require low profile, compact, low cost yet also high gain and wide bandwidth millimeter-wave antennas.

To the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

It is to be appreciated that the term "substantially" in conjunction with another term as used herein is intended to refer an attempt to achieve a desired outcome associated with the other term while being within an acceptable tolerance of the desired outcome. For example, "substantially equal" can equate to "equal" with an acceptable tolerance, such as manufacturing variances when attempting to achieve "equal" may be within acceptable tolerances while not being exactly "equal".

Further, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

Conventional antenna technologies have some drawbacks with respect to certain antenna applications (e.g., millimeter-wave antenna applications, etc.). On the other hand, various embodiments disclosed herein provide for an improved antenna (e.g., a circularly polarized (CP) planar aperture antenna) that can be employed in, for example, millimeter-wave antenna applications. In this regard, and now referring to FIG. 1, a perspective view of an antenna 100 is illustrated, in accordance with various embodiments. The antenna 100 can be, for example, a circularly polarized (CP) planar aperture antenna, a millimeter-wave antenna, another type of antenna, etc. In one example, the antenna 100 can be employed in a millimeter-wave communication system. In one example, the antenna 100 can be employed in a consumer level millimeter-wave product. It is to be appreciated that antenna 100 can be employed in any suitable millimeter-wave application.

Antenna 100 includes patch section 104 on a top surface of substrate 112. Patch section 104 can be implemented as a metallic clad surface section (e.g., a copper clad surface section, etc.) overlying, embedded in, or at a top surface of substrate 112. Patch section 104 can have an electrically conductive pin 118 (e.g. vias, electrical connection, metallic pin, etc.) that conductively connects patch section 104 to ground plane 110. In a non-limiting example, electrically conductive pin 118 can be located at a center, such as a geometric center of patch section 104. Antenna 100 also includes an opening cavity that is formed by cavity section 106 and cavity section 108. In one example, cavity section 106 comprises a plurality of electrically conductive pins 114a through 114ap (e.g. vias, electrical connection, metallic pin, etc.) in substrate 112 that are conductively connected to ground plane 110 at a bottom surface of substrate 112, and are conductively connected to each other at a top surface of substrate 112, for example by a metallic clad surface portion (e.g., a copper clad surface portion, etc.) overlying, embedded in, or at a top surface of substrate 112. Cavity section 106 comprises a plurality of electrically conductive pins 116a through 116ap (e.g. vias, electrical connection, metallic pin, etc.) in substrate 112 that are connected to ground plane 110 and are conductively connected to each other at a top surface of substrate 112, for example by a metallic clad surface portion (e.g., a copper clad surface portion, etc.) overlying, embedded in, or at a top surface of substrate 112. In an implementation, substrate 112 can be a single layer. Advantageously, a single layer substrate can allow antenna 100 to have a lower profile and a lower cost. In another implementation, substrate 112 can be multilayer.

In an implementation, an electrically conductive pin 114a and an electrically conductive pin 114ap included in cavity section 106 can correspond to half an electrically conductive pin, while other electrically conductive pins in cavity section 106 can correspond to a full electrically conductive pin. In another implementation, electrically conductive pins 114a through 114ap included in cavity section 106 can correspond to a full electrically conductive pin. In an implementation, an electrically conductive pin 116a and an electrically conductive pin 116ap included in cavity section 108 can correspond to half an electrically conductive pin, while other electrically conductive pins in cavity section 106 can correspond to a full electrically conductive pin. In another implementation, electrically conductive pins 116a through 116ap included in cavity section 106 can correspond to a full electrically conductive pin.

In another example (not depicted), cavity section 106 and cavity section 108 can each be made of a metal block through the entire height of substrate 112 in the shapes of cavity section 106 and cavity section 108 depicted in FIG. 1, and conductively connected to ground plane 110. This configuration of cavity sections 106 and 108 can be considered ideal operationally, however, employing electrically conductive pins as discussed above can provide for an easier fabrication process of antenna 100. In an additional example (not depicted), cavity section 106 and cavity section 108 can each be made of a solid metal block through a portion of the height of substrate in the shapes of cavity section 106 and cavity section 108 depicted in FIG. 1 and connected to ground plane 110 and/or a top surface of substrate 112 by a plurality of electrically conductive pins.

In an implementation, patch section 104 is a crossed patch formed in a windmill shape, and cavity section 106 and cavity section 108 are located on opposite sides of and surrounding patch section 104 to form an opening cavity also shaped in the form of windmill. It is to be appreciated that patch section 104 or opening cavity (e.g. cavity section 106 and cavity section 108) can be forming into any suitable shape to produce circularly polarized (CP) radiation. Antenna 100 can be rotationally symmetric about a center, such as in a non-limiting example a geometric center, of antenna 100. In a non-limiting example, the center of antenna 100 can coincide with electrically conductive pin 118.

Antenna 100 can also include feed line 122 that conductively couples patch section 104 to a first connection of a differential feed. Antenna 100 can also include feed line 120 that conductively couples patch section 104 to a second connection of the differential feed. In an example, feed lines 120 and 122 can be overlying, embedded in, or at a top surface of substrate 112. In a non-limiting example, feed line 122 can be conductively coupled to a negative connection of the differential feed and feed line 120 can be conductively coupled to a positive connection of the differential feed. In another example, feed line 120 can be conductively coupled to a negative connection of the differential feed and feed line 122 can be conductively coupled to a positive connection of the differential feed. In a non-limiting example, the differential feed is provided by grounded co-planar waveguide (GCPW). GCPW advantageously provides a low radiation loss characteristic. It is to be appreciated that other mechanisms for providing the differential feed to patch section 104 can be implemented, such as microstrip line, waveguide, single ended feeding, or any other suitable mechanism for providing a feed to patch section 104.

Employment of differential feeding can allow for eliminating the need for bulky off-chip and lossy on-chip baluns when integrating antenna 100 with differential millimeter-wave (mmWave) monolithic integrated circuits, and offers high polarization purity. The windmill shape of the opening cavity and crossed-patch mitigate the differences in field distribution within the opening cavity and minimizes energy reflection at the interfaces of walls of the opening cavity, the patch section 104, and feed lines 120 and 122. In addition, the use of symmetrical geometry and differential feeds (e.g., differential excitation) results in more even energy transfer, and thus higher gain and more stable and symmetric radiation patterns within a wide frequency band.

Antenna 100 can be formed in a 180° rotationally-symmetric windmill-shaped aperture-patch formation to generate circular polarizations as well as high gain unidirectional radiation. This is due to the resultant uniform field aperture distribution within the relatively large physical aperture of the antenna and using an opening cavity of one quarter-wavelength $\lambda_g/4$ height (h dimension), where $\lambda_g$ is the guided wavelength. In an example, antenna 100 configured to operate at 60 GHz band, exhibited a high gain of 14.2 dBi, wide axial ratio and impedance bandwidths of 18% (56.5-67.5 GHz), and a notable 85% aperture-efficiency.

Figure 2:
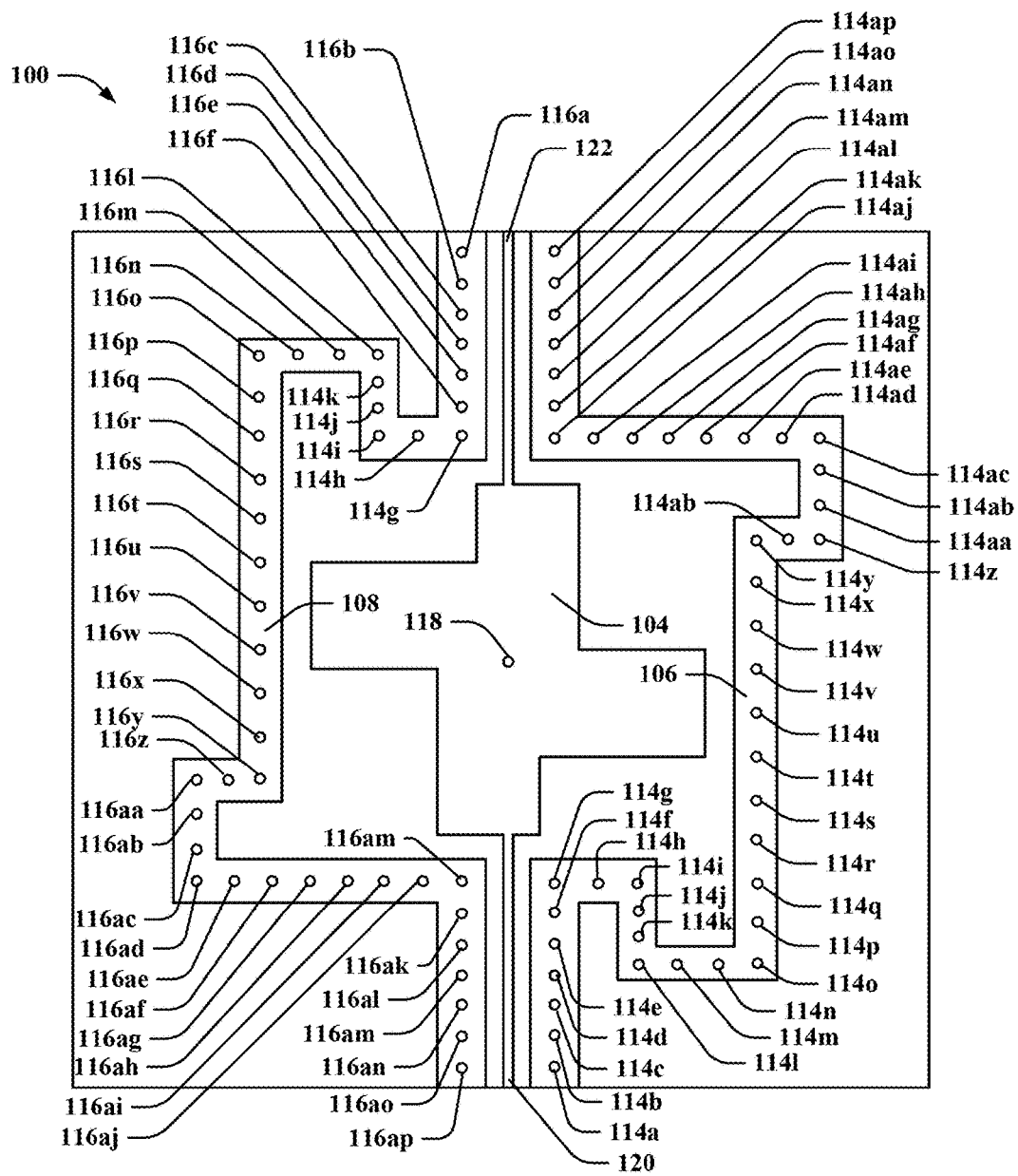
FIG. 2 illustrates a top view of an exemplary antenna, in accordance with various embodiments.

Referring to FIG. 2 is a top view of antenna 100. Antenna 100 depicts cavity section 106 including electrically conductive pins 114a through 114ap and cavity section 108 including electrically conductive pins 116a through 116ap. It is to be appreciated that the number and diameter of electrically conductive pins in cavity sections 106 and 108 can vary from the number depicted in FIG. 2, for example based upon targeted performance at designed operating wavelengths $\lambda_o$ of antenna 100. In a non-limiting example, electrically conductive pins 114a through 114ap can be substantially equal distant from directly adjacent electrically conductive pins 114a through 114ap, and electrically conductive pins 116a through 116ap can be substantially equal distant from directly adjacent electrically conductive pins 116a through 116ap. In another example, electrically conductive pins 114a through 114ap can be varying distant from directly adjacent electrically conductive pins 114a through 114ap, and electrically conductive pins 116a through 116ap can be varying distant from directly adjacent electrically conductive pins 116a through 116ap. In a non-limiting example, electrically conductive pins 114a through 114ap can be substantially equal diameter, and electrically conductive pins 116a through 116ap can be substantially equal diameter. In a non-limiting example, electrically conductive pins 114a through 114ap can be varying diameter, and electrically conductive pins 116a through 116ap can be varying diameter.

It is to be appreciated that while FIG. 1 depicts electrically conductive pins 114a through 114ap, 116a through 116ap, and 118 as cylindrical, said electrically conductive pins can be configured in any suitable shape, not limiting examples of which include a square prism, a rectangular prism, a triangular prism, an L-shaped prism, a cone, a pyramid, or any other suitable shape. Additionally, electrically conductive pins 114a through 114ap, 116a through 116ap, and 118 can be the same shape or varying shapes.

The working principle of antenna 100 is different from that of conventional cavity-backed patch antennas which are based on resonance. The energy in antenna 100, in the form of traveling waves, mainly flows within the physical aperture of antenna 100 to achieve a high gain. Avoiding resonance and utilizing traveling wave excitation along the long patch potentially enables wideband operation of antenna 100. Antenna 100 is also different from other aperture antennas working at mmWave bands, which are also considered traveling-wave based antennas. For example, patch section 104 carries traveling wave energy into and within the antenna's aperture (e.g. opening cavity). Patch section 104 acts as both transmission body and radiator, whereas the opening cavity and its peripheral cavity sections 106 and 108 make the physical aperture of antenna 100 through which energy is mainly radiated.

Figure 4A:
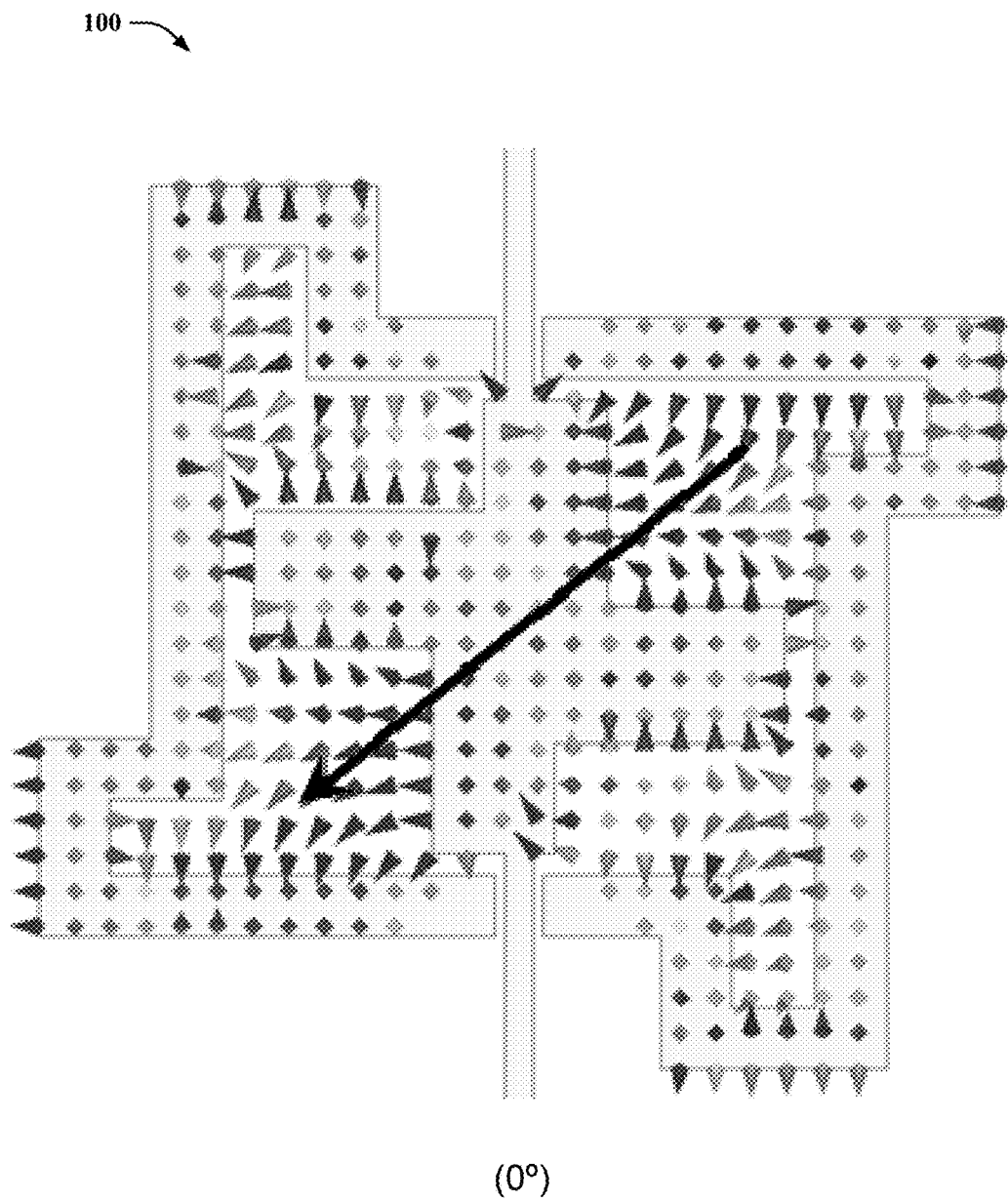
FIGS. 4A, 4B, 4C, and 4D illustrates a vector direction of the E-field distribution rotating in a clockwise manner with phase of exemplary antenna, in accordance with various embodiments.
Figure 4B:
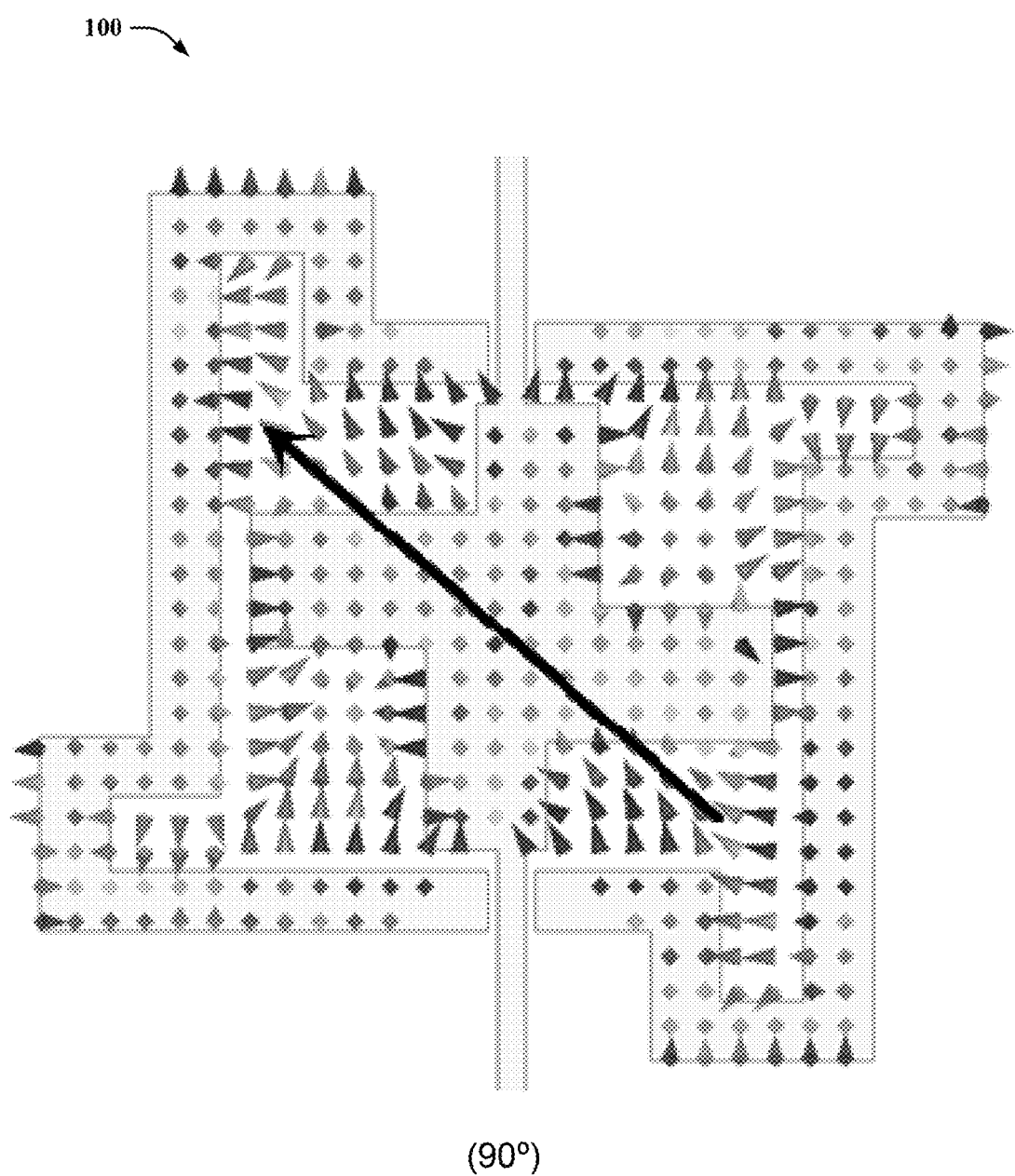
Figure 4C:
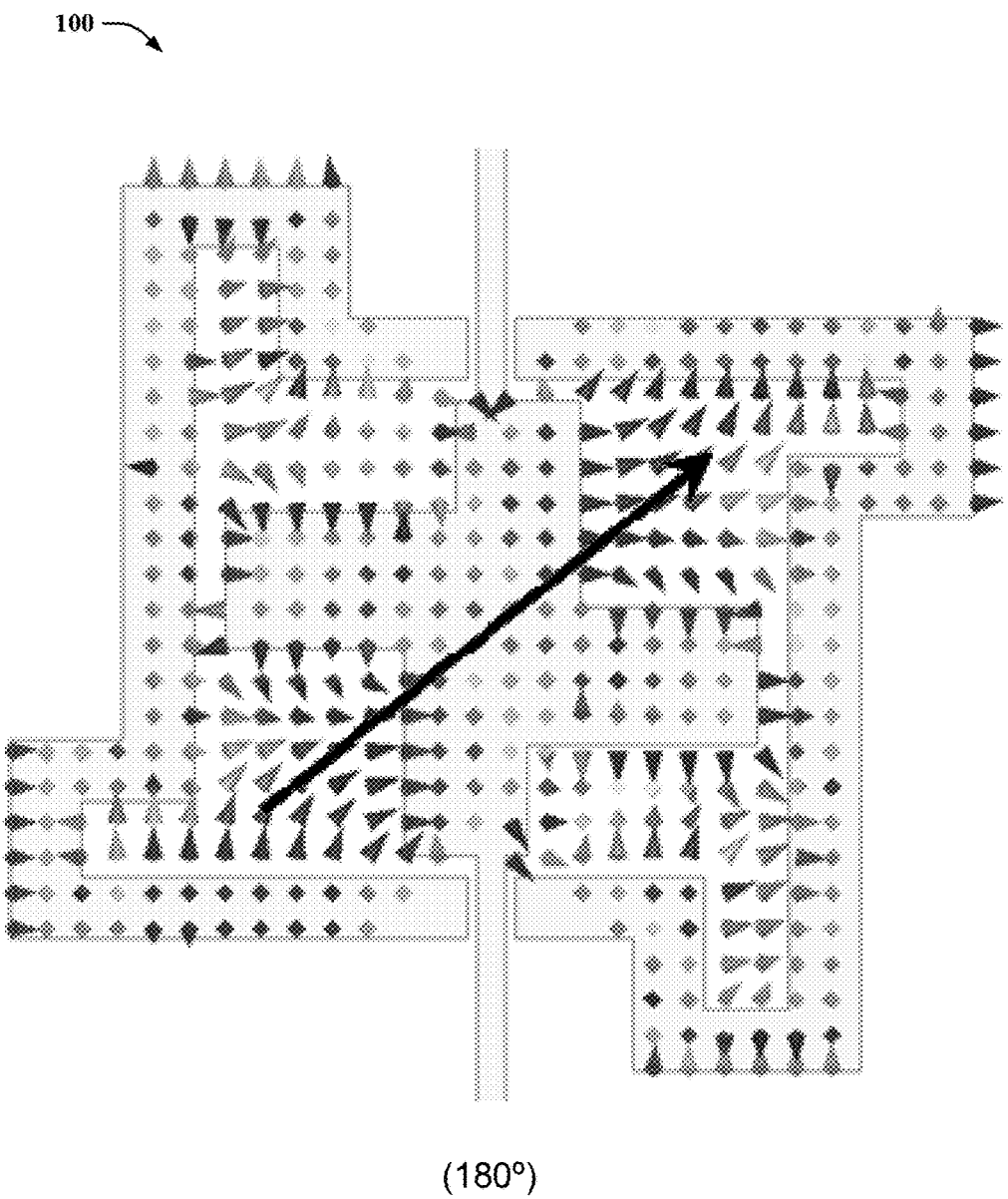
Figure 4D:
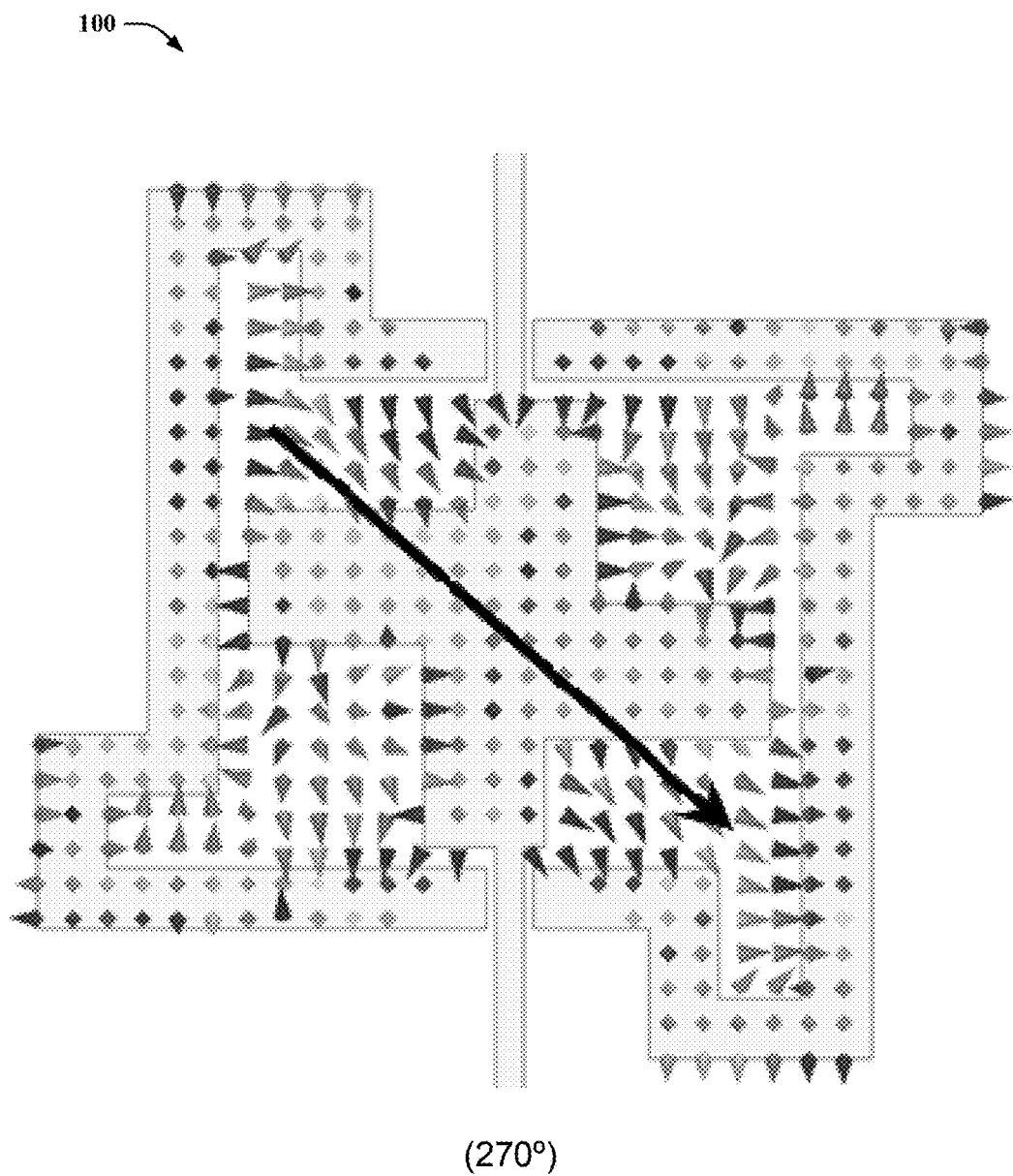

While a portion of the energy traveling along patch section 104 is radiated from patch section 104, a considerable portion of the energy flows through the physical aperture (e.g. the opening cavity and its peripheral cavity sections 106 and 108) first before radiating to free space. The current is mostly concentrated along the edges of patch section 104, which excites E-fields nearby within the physical aperture. The current vector changes with phase in a rotational manner, and consequently so is the generated E-field vector while a strong current corresponds to high E-field magnitude. This behavior of existing E-field distribution can be decomposed into two modes, which are 90° rotationally symmetric and have similar magnitude and quadrature phase difference. This provides an insight into the mechanism of circularly polarized (CP) operation in antenna 100. At different phases, these two modes are excited with different intensities as the traveling wave current changes with phase along the patch edges. Meanwhile, the net vector direction of the E-field distribution, which represents the superposition of the two modes in antenna aperture, appears to rotate in a clockwise manner with phase, as depicted in FIGS. 4A, 4B, 4C, and 4D. A first mode is depicted in FIGS. 4A and 4C where at 0°/180° the first mode reaches its positive/negative peak, and a second mode is depicted in FIGS. 4B and 4D where at 90°/270° the second mode reaches its positive/negative peak. The direction of this rotation determines the sense of polarization of the antenna radiation, which, in the case of antenna 100 as depicted in FIGS. 4A-4D, is Left-Handed circularly polarized (LHCP) radiation. It is to be appreciated that antenna 100 can be configured such that opening cavity (e.g. cavity sections 106 and 108) and patch section 104 are oriented (e.g. such as a mirror image to the orientation depicted in FIG. 2) to generate Right-Handed circularly polarized (RHCP) radiation.

Antenna 100 can have a condition that there is an excited uniform aperture field distribution (corresponding to the highest aperture efficiency) in a large physical aperture (i.e. larger than one wavelength in diameter) which guarantees high gain at broadside direction. In addition, the field around the edges of the opening cavity (e.g. cavity sections 106 and 108) contributes to the radiation, which makes the actual aperture of antenna 100 even larger than the size of its physical aperture (e.g. the opening cavity and its peripheral cavity sections 106 and 108), and thus helps to further increase the gain. In addition, the antenna adopts a cavity with a height of one quarter of guided wavelength ($\lambda_g/4$) at operating frequency, which ensures the highest aperture E-field amplitude, where $\lambda_g$ is the guided wavelength. The center of patch section can be a virtual AC grounded point which can be shorted by an electrically conductive pin 118 to reduce the effect when the differential feed input signal is not a perfect differential signal. Advantageously, using differential feeding leads to more even energy transfer to antenna 100, which as a result guarantees the purity of the excited modes and improves circularly polarized (CP) performance.

Referring back to FIG. 1, height (h) of the opening cavity ($\lambda_g/4$) corresponds to the thickness of most commercially available laminates at millimeter-wave band. Table 1 depicts one quarter-wavelength ($\lambda_g/4$) in the materials of two widely used commercial laminates, employable in a non-limiting example for substrate 112, RT/duroid 5880 and 6010 at different frequencies in millimeter-wave bands. It is to be appreciated that any suitable laminate is employable for substrate 112. Employment of commercially available laminates for substrate 112 allows for antenna 100 to be compatible with standard planar circuit technology, such as Printed-Circuit-Broad (PCB) and Low Temperature Co-fired Ceramic (LTCC) technologies, at millimeter-wave bands and suitable for mass production of a low cost and low profile antenna 100. Furthermore, antenna 100 can provide wide operating bandwidth, improved radiation performance, stable radiation performance, wide impedance bandwidth, symmetrical radiation patterns at different frequencies over an operating bandwidth, and stable radiation patterns at different frequencies over an operating bandwidth, low back radiation, low cross polarization, high gain, stable gain, and/or other improvements to electrical characteristics.

TABLE I

A Quarter-Wavelength in the Materials of RT/duroid 5880 and 6010

| Freq. (GHz) | 30 | 60 | 90 | 120 |
|---|---|---|---|---|
| $\lambda_g/4$ in RT/duroid 5880 with $\varepsilon_r$ = 2.2 (mm) | 1.686 | 0.843 | 0.562 | 0.421 |
| $\lambda_g/4$ in RT/duroid 6010 with $\varepsilon_r$ = 10.2 (mm) | 0.783 | 0.391 | 0.261 | 0.196 |

Figure 3:
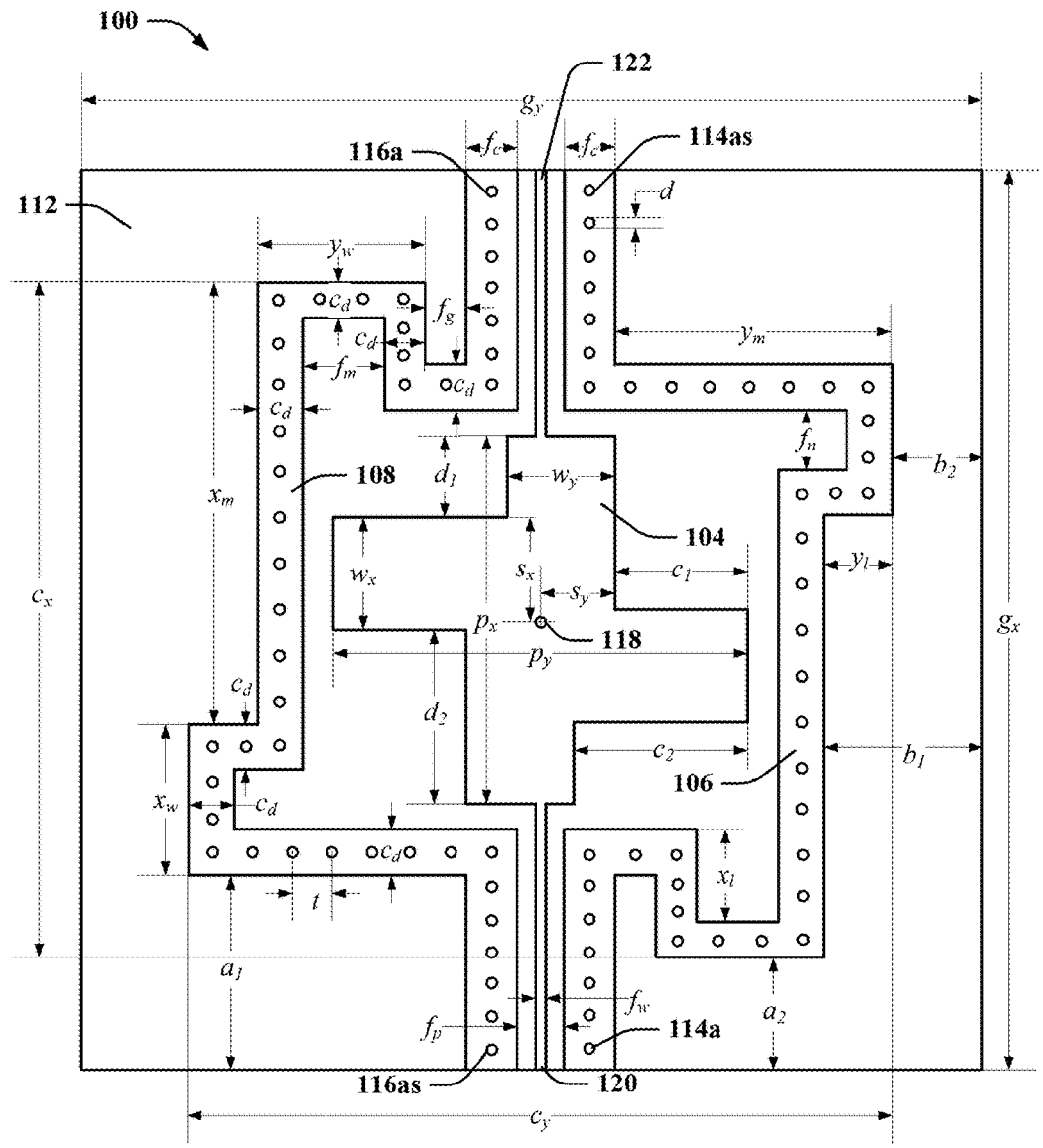
FIG. 3 illustrates a top view of an exemplary antenna indicating dimensions, in accordance with various embodiments.

Antenna 100 can be employed for antenna applications at various frequencies, such as but not limited to, a 38 GHz band, a 55 GHz band, a 60 GHz band, a 65 GHz band, a 77 GHz band, etc. Referring to FIG. 3, a top view of antenna 100 is depicted where dimensions $g_y$, $g_x$, $c_x$, $c_y$, $p_x$, $p_y$, $w_x$, $w_y$, $s_x$, $s_y$, $x_l$, $y_l$, $x_w$, $y_w$, $x_m$, $y_m$, $c_d$, $c_1$, $c_2$, d, $d_1$, $d_2$, t, $f_c$, $f_w$, $f_p$, $f_g$, $f_m$, $f_n$, $a_1$, $a_2$, $b_1$, and $b_2$ are identified. It is to be appreciated that the dimensions of antenna 100 are selected according to the operating wavelength(s) target for antenna 100. For example, 60 GHz band has been allocated as unlicensed band by many countries and has become one of the most potential millimeter-wave bands. Table II provides example dimensions of antenna 100 working at 60-GHz band. It is based on single layer Rogers RT/duroid 5880 ($\varepsilon$=2.2, tan $\delta$=0.0009) substrate with the thickness of 0.787 mm and copper layer thickness of 9 μm using standard PCB technology. Substrate 112 thickness 0.787 mm corresponds to approximately a quarter-wavelength in the dielectric at 60 GHz, as given in Table I.

TABLE II

Design parameters and dimension values of antenna 100 at 60 GHz

| Parameter | $g_x$ | $g_y$ | $c_x$ | $c_y$ | $p_x$ | $p_y$ | $w_x$ | $w_y$ |
|---|---|---|---|---|---|---|---|---|
| Value (mm) | 14 | 14 | 9.1 | 10 | 4.7 | 5.6 | 1.45 | 1.3 |
| Value ($\lambda_0$) | 2.8 | 2.8 | 1.82 | 2 | 0.94 | 1.12 | 0.29 | 0.26 |
| Parameter | $s_x$ | $s_y$ | $x_l$ | $y_l$ | $x_w$ | $y_w$ | $x_m$ | $y_m$ |
| Value (mm) | 1.32 | 0.92 | 1.3 | 1.1 | 2 | 2.45 | 5.7 | 3.8 |
| Value ($\lambda_0$) | 0.26 | 0.18 | 0.26 | 0.22 | 0.4 | 0.49 | 1.14 | 0.76 |
| Parameter | $c_d$ | d | t | h | $f_c$ | $f_w$ | $f_p$ | $f_g$ |
| Value (mm) | 0.7 | 0.3 | 0.6 | 0.79 | 1 | 0.3 | 0.5 | 0.3 |
| Value ($\lambda_0$) | 0.14 | 0.06 | 0.12 | 0.16 | 0.2 | 0.06 | 0.1 | 0 |
| Parameter | $f_m$ | $f_n$ | $a_1$ | $a_2$ | $b_1$ | $b_2$ | $c_1$ | $c_2$ |
| Value (mm) | 0.85 | 0.7 | 3.75 | 2.45 | 3.15 | 2.05 | 1.88 | 2.43 |
| Value ($\lambda_0$) | 0.17 | 0.14 | 0.75 | 0.49 | 0.63 | 0.41 | 0.38 | 0.49 |
| Parameter | $d_1$ | | | | $d_2$ | | | |
| Value (mm) | 1.03 | | | | 2.23 | | | |
| Value ($\lambda_0$) | 0.21 | | | | 0.45 | | | |

*$\lambda_0$ refers to the wavelength in free space at 60 GHz, namely 5 mm.

Figure 5:
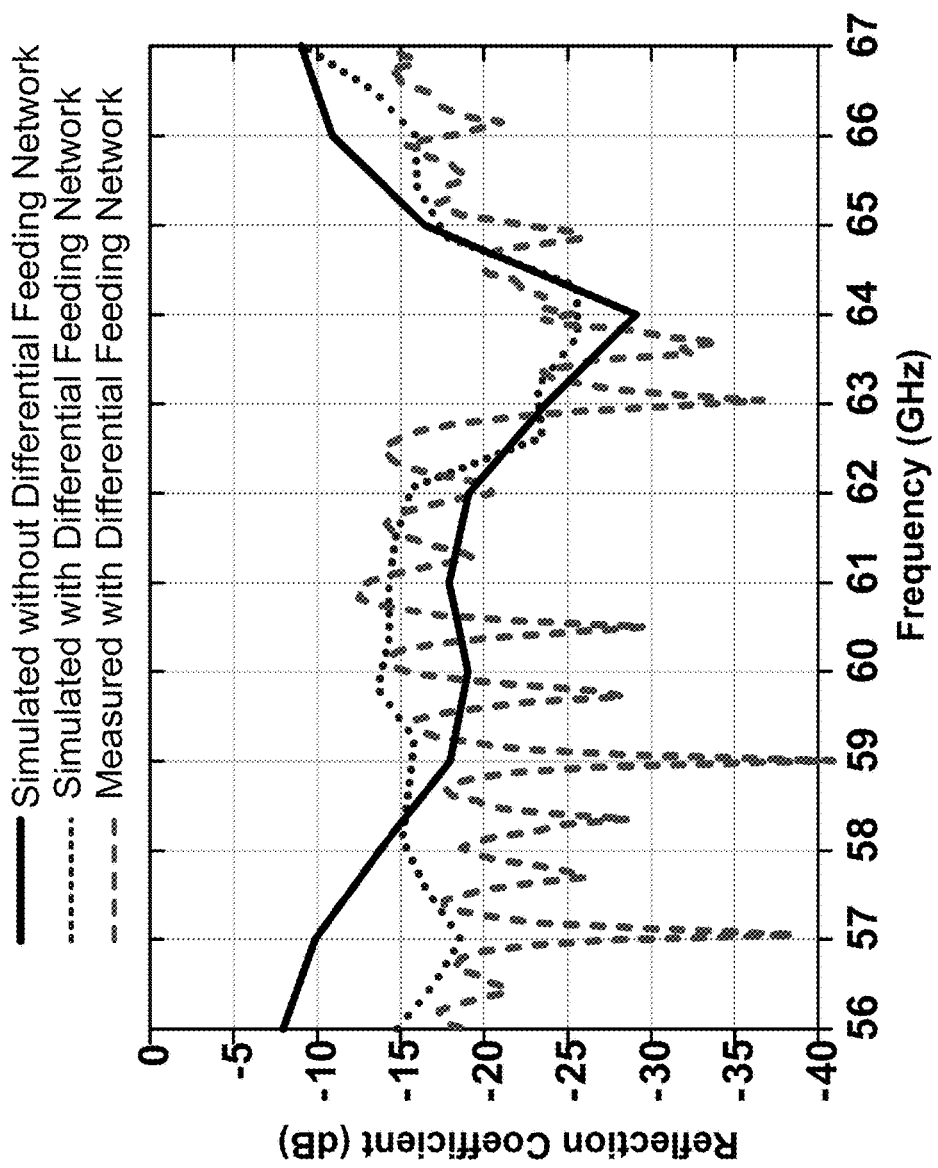
FIG. 5 illustrates a graph of measured and simulated reflection coefficients of an exemplary antenna with and without the differential feeding network in accordance with various embodiments.
Figure 14:
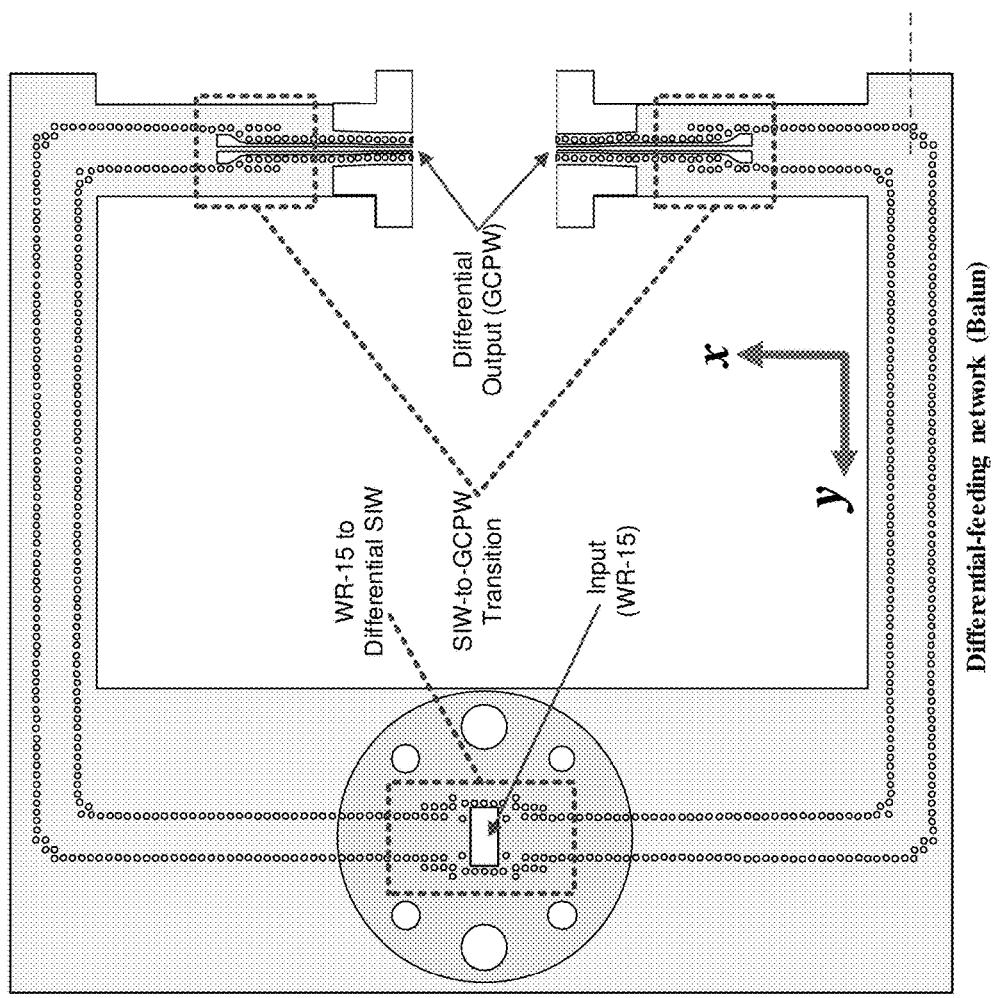
FIGS. 14 and 15 illustrates an exemplary differential feeding network, in accordance with various embodiments.
Figure 15:
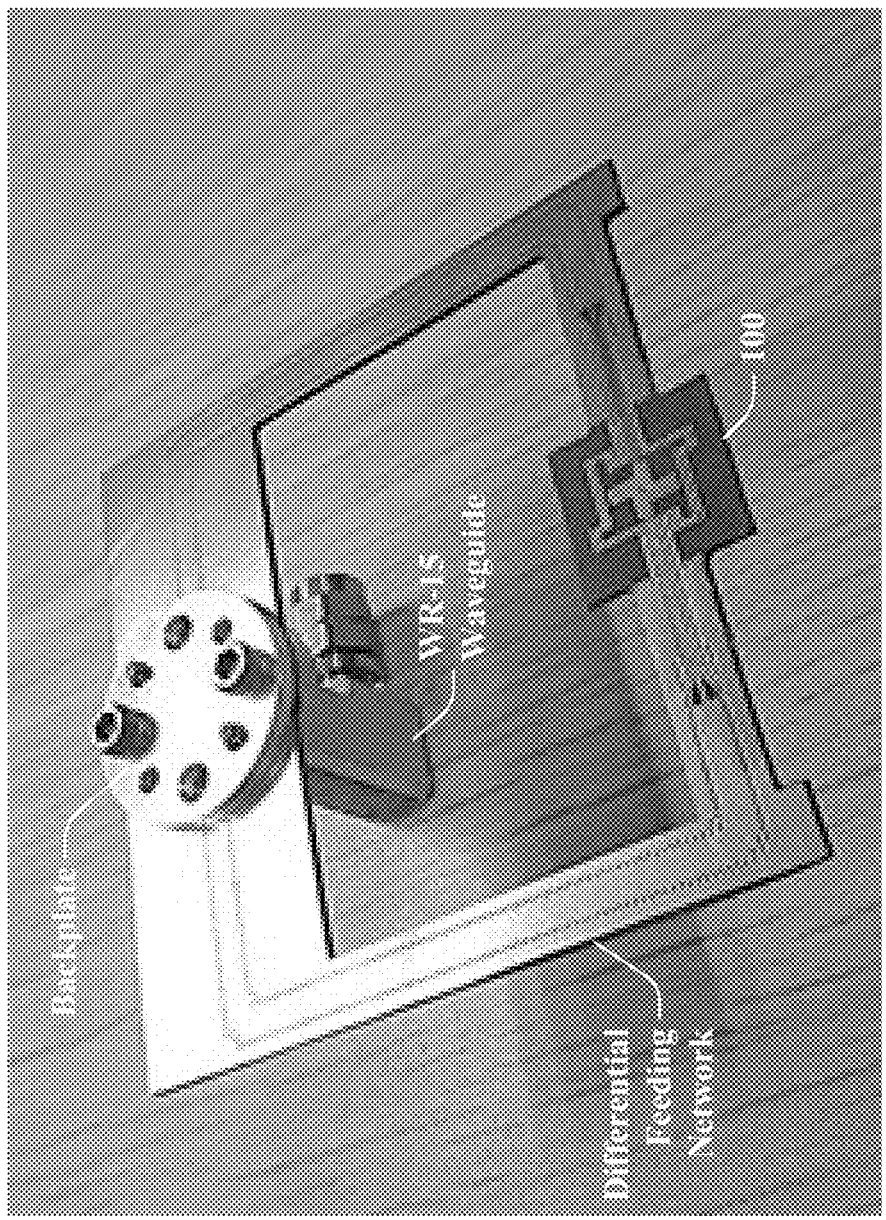

Referring to FIG. 5, a graph is depicted of measured and simulated reflection coefficients of antenna 100 with and without the differential feeding network at the dimensions given for 60 GHz wavelength in table II. For measurements, a differential feeding network was used to feed the antenna, a non-limiting example of which is depicted in FIGS. 14 and 15. FIGS. 14 and 15 employ a WR-15 waveguide that provides input to a substrate integrated waveguide (SIW) to generate the differential output feed at the grounded coplanar waveguide (GCPW). However, there is no need for the differential feeding network in practical applications. Both the measurement and the simulation of antenna 100 integrated with differential feeding network depicted in FIG. 5 show −10-dB impedance bandwidths of more than 17.9% (56-67 GHz), whereas the simulation for the antenna without the differential feeding networking show an impedance bandwidth of 17% (57-66.5 GHz).

Figure 6:
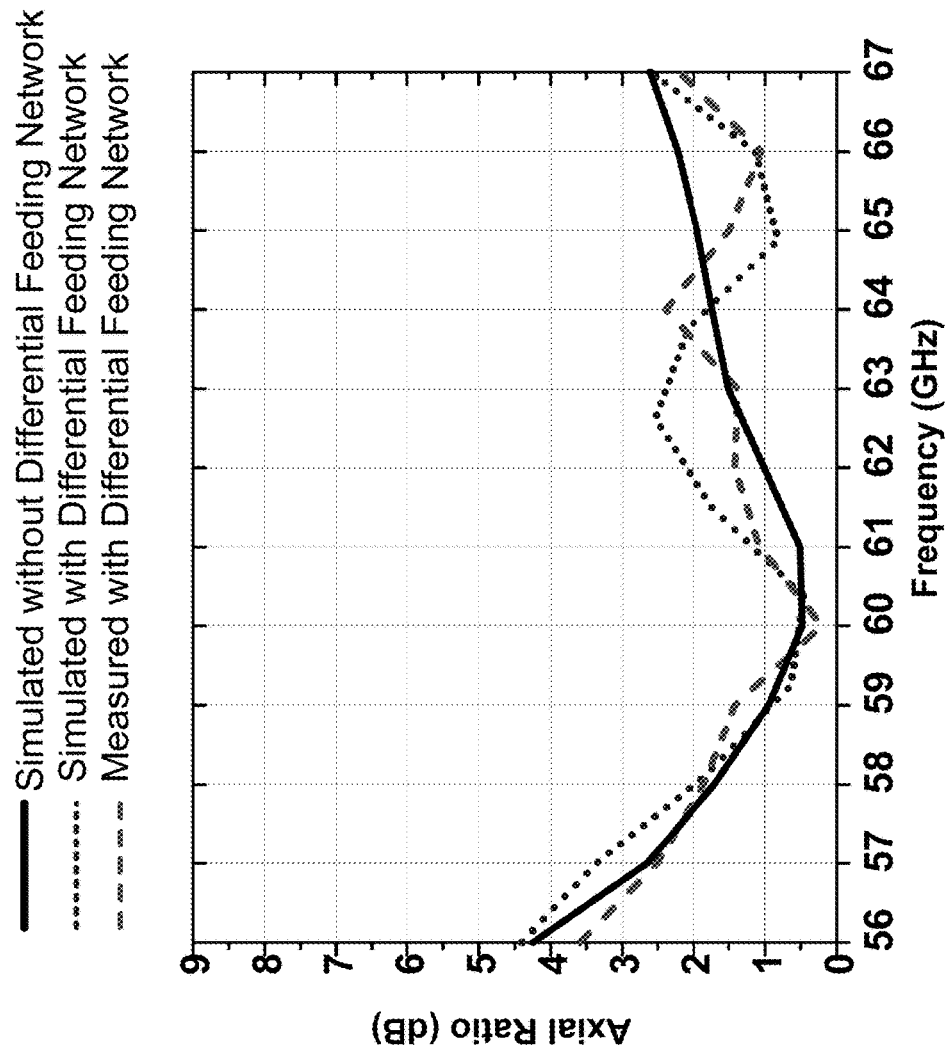
FIG. 6 illustrates a graph of measured and simulated axial ratio (AR) of an exemplary antenna with and without the differential feeding network in accordance with various embodiments.

Referring to FIG. 6, a graph is depicted of measured and simulated axial ratio (AR) of antenna 100 with and without the differential feeding network at the dimensions given for 60 GHz wavelength in table II. Antenna 100 integrated with the differential feeding network, shows a simulated 3-dB AR bandwidth of 16.3% (57.3-67.3 GHz), whereas the measured AR bandwidth is 17.9% (56.5-67.5 GHz). Antenna 100 without the feeding network, shows a simulated AR bandwidth of 17.4% (56.8-67.5 GHz). Thus, the measured and simulated results in the two cases are also in good agreement.

Figure 7:
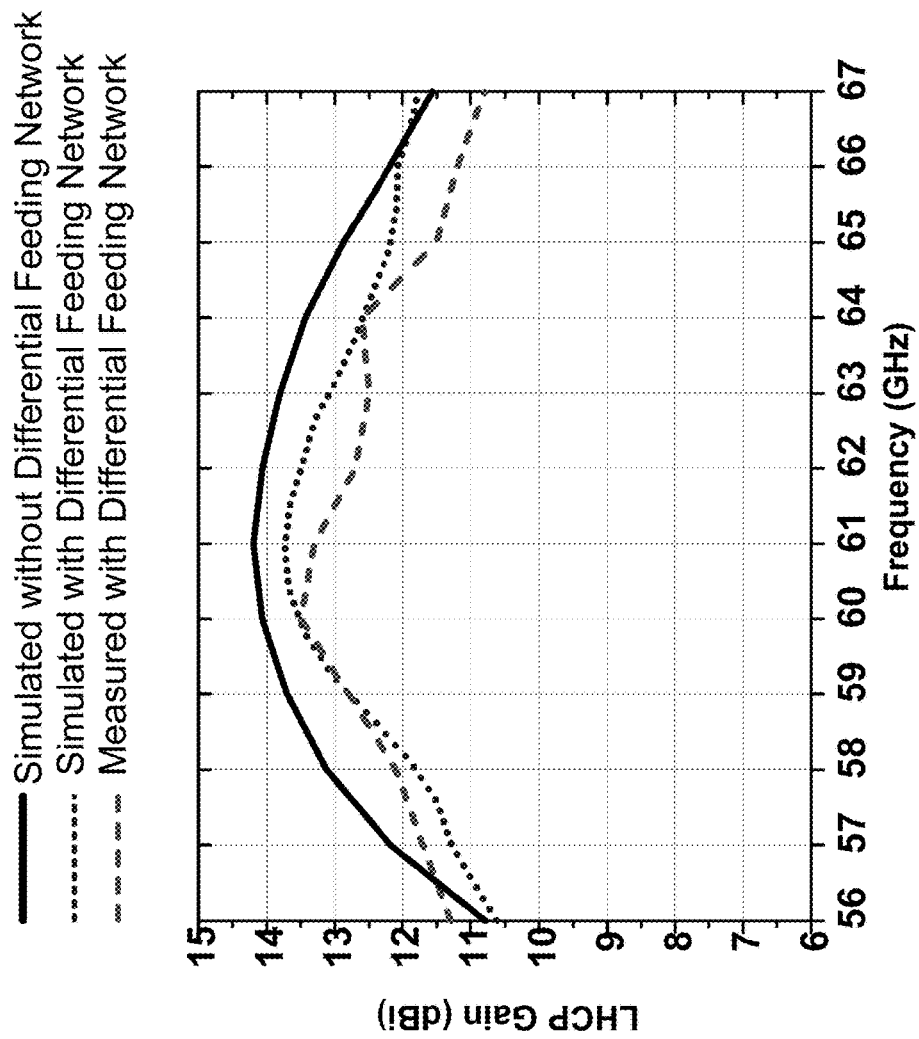
FIG. 7 illustrates a graph of measured and simulated broadside CP gain (e.g. LHCP gain) of an exemplary antenna with and without the differential feeding network in accordance with various embodiments.
Figure 8:
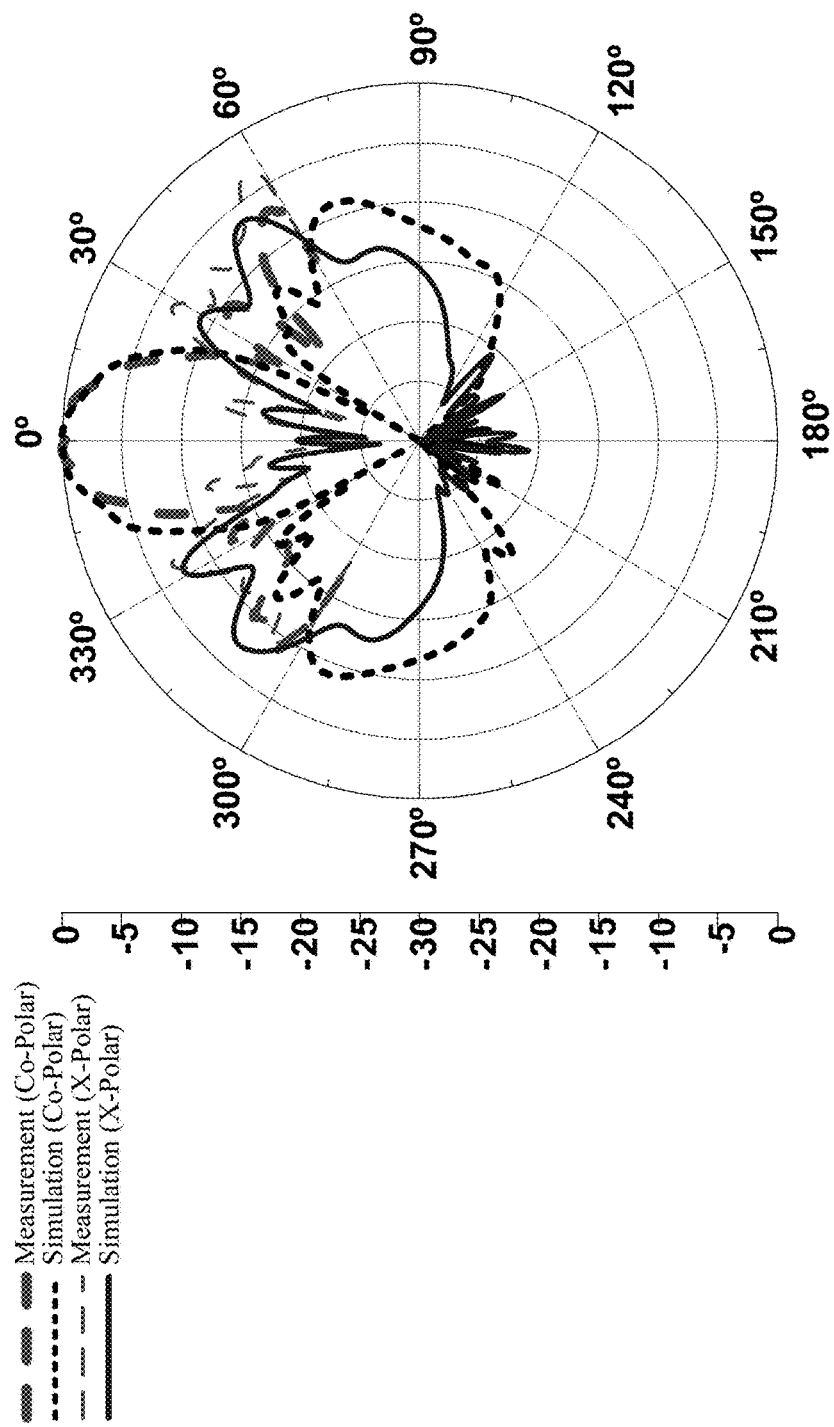
FIG. 8 illustrates measured and simulated radiation patterns an exemplary antenna at XZ-plane at 58 GHz, in accordance with various embodiments.
Figure 9:
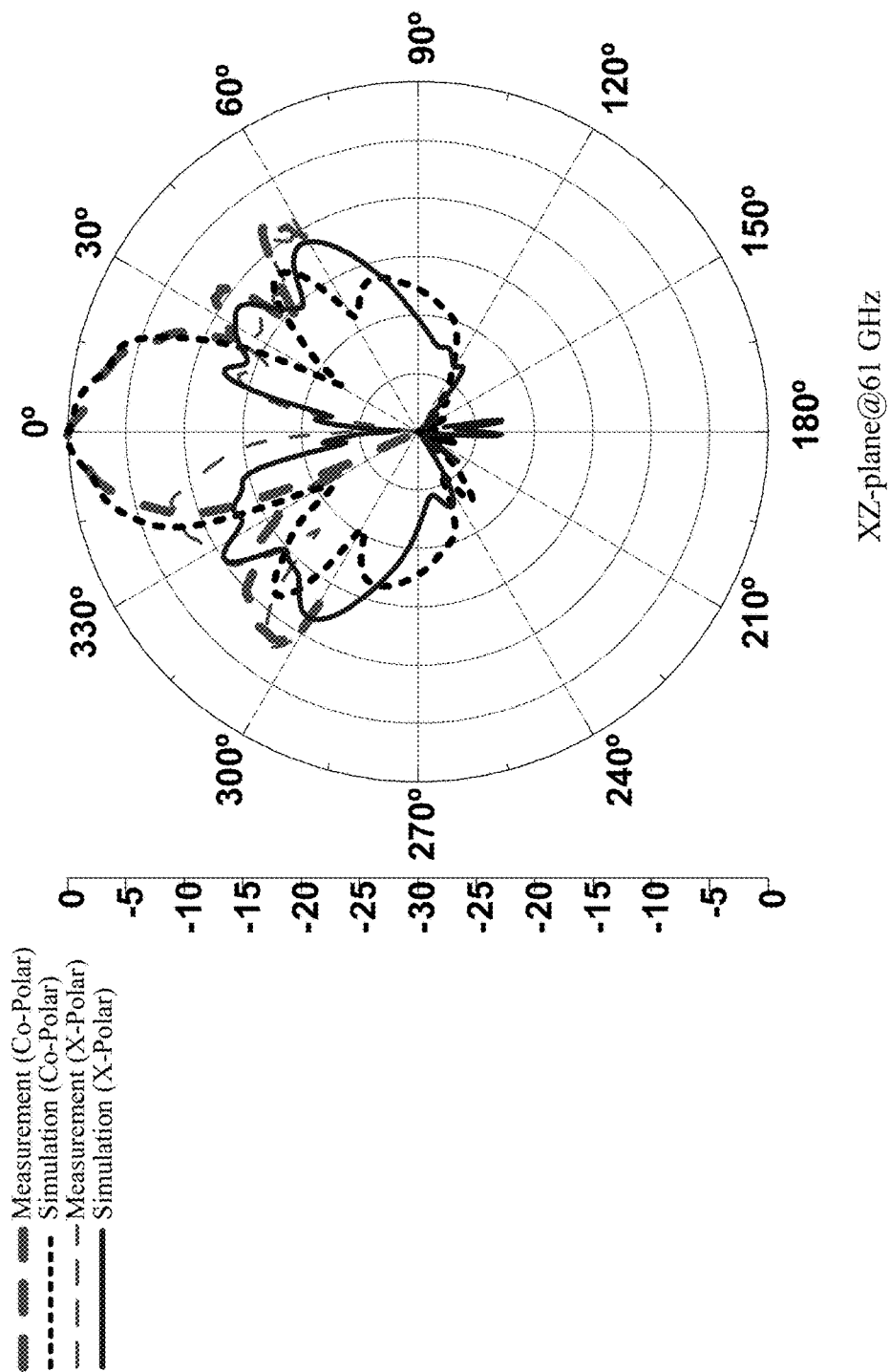
FIG. 9 illustrates measured and simulated radiation patterns an exemplary antenna at XZ-plane at 61 GHz, in accordance with various embodiments.
Figure 10:
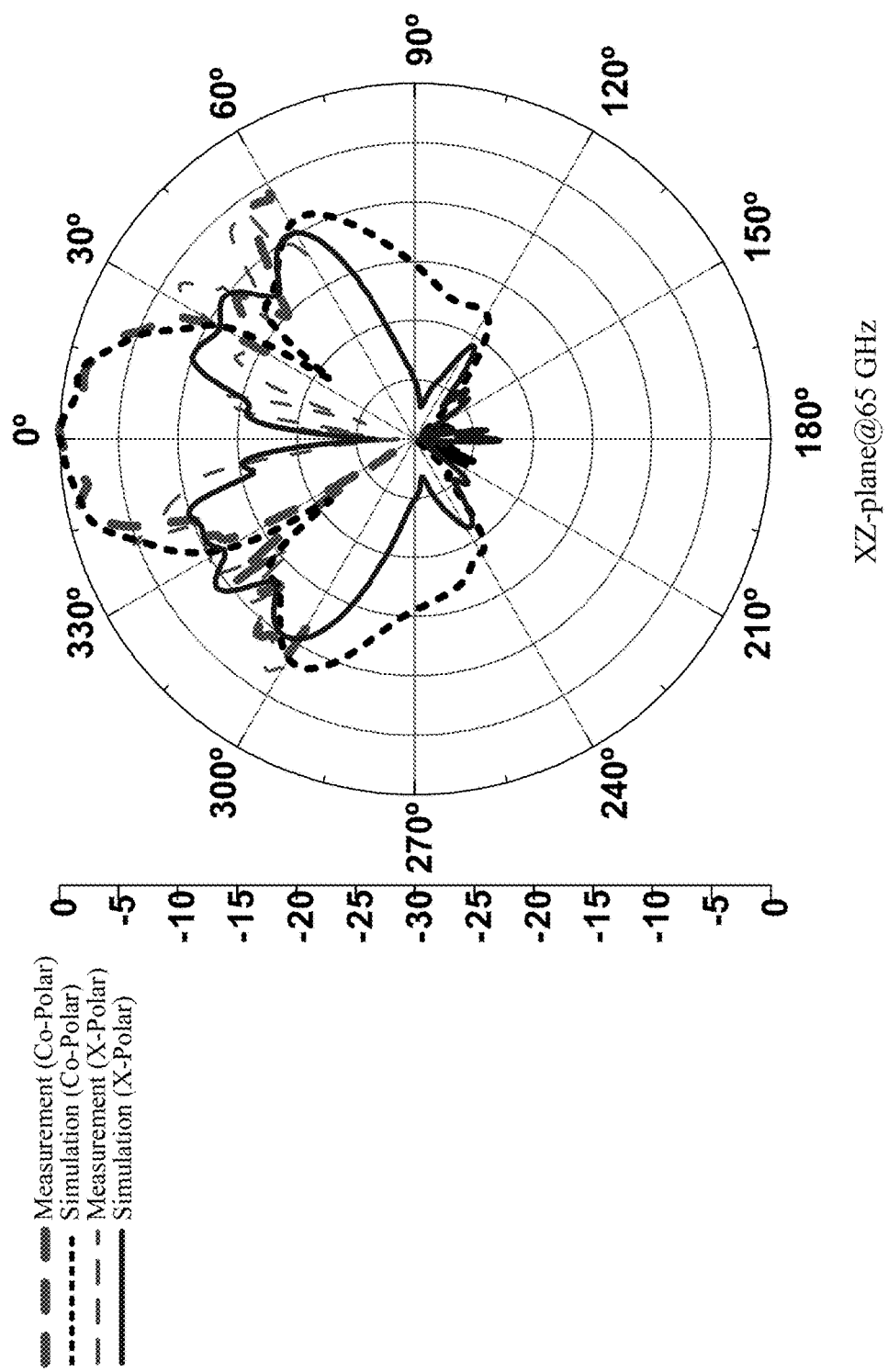
FIG. 10 illustrates measured and simulated radiation patterns an exemplary antenna at XZ-plane at 65 GHz, in accordance with various embodiments.
Figure 11:
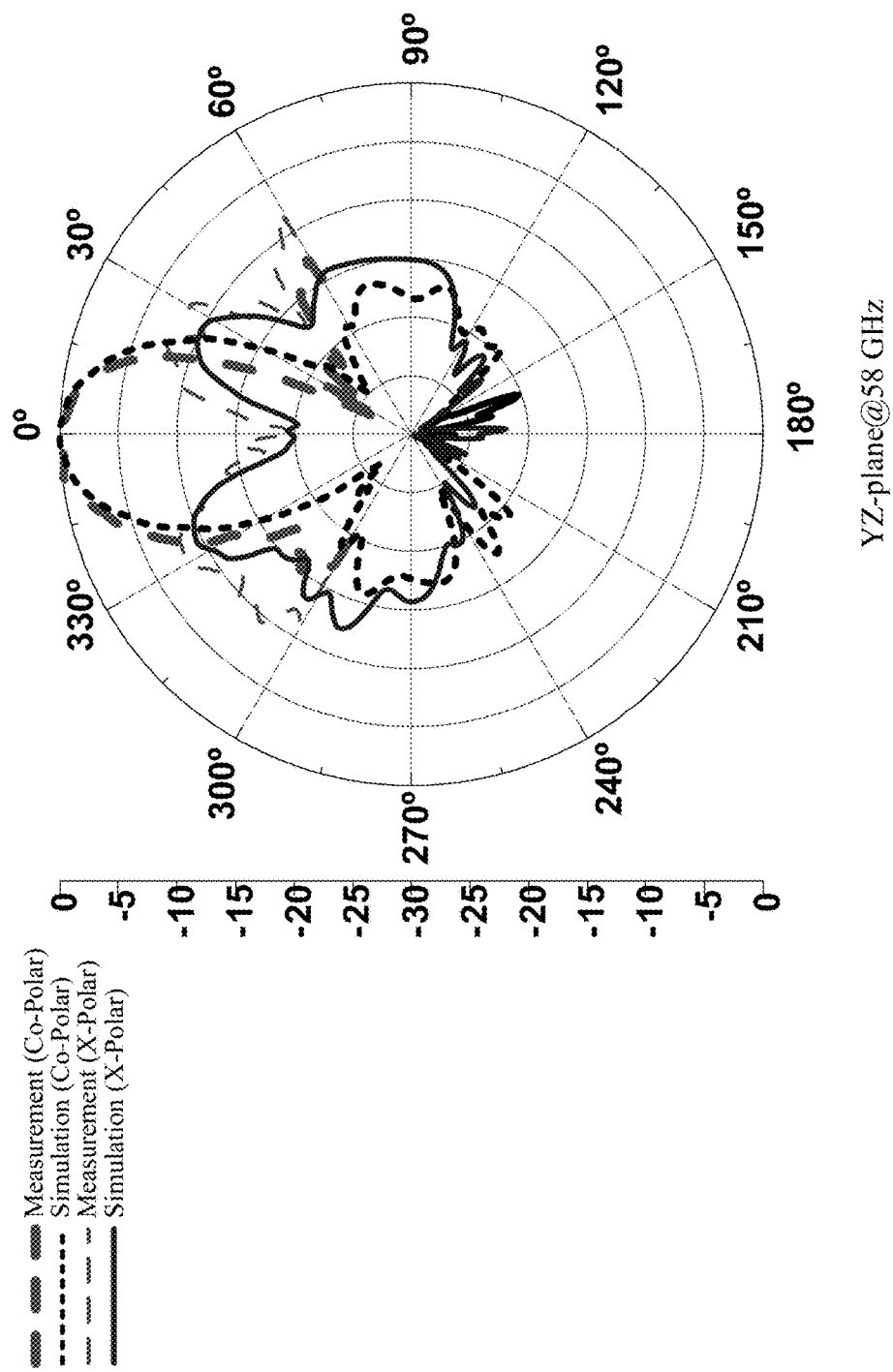
FIG. 11 illustrates measured and simulated radiation patterns an exemplary antenna at YZ-plane at 58 GHz, in accordance with various embodiments.
Figure 12:
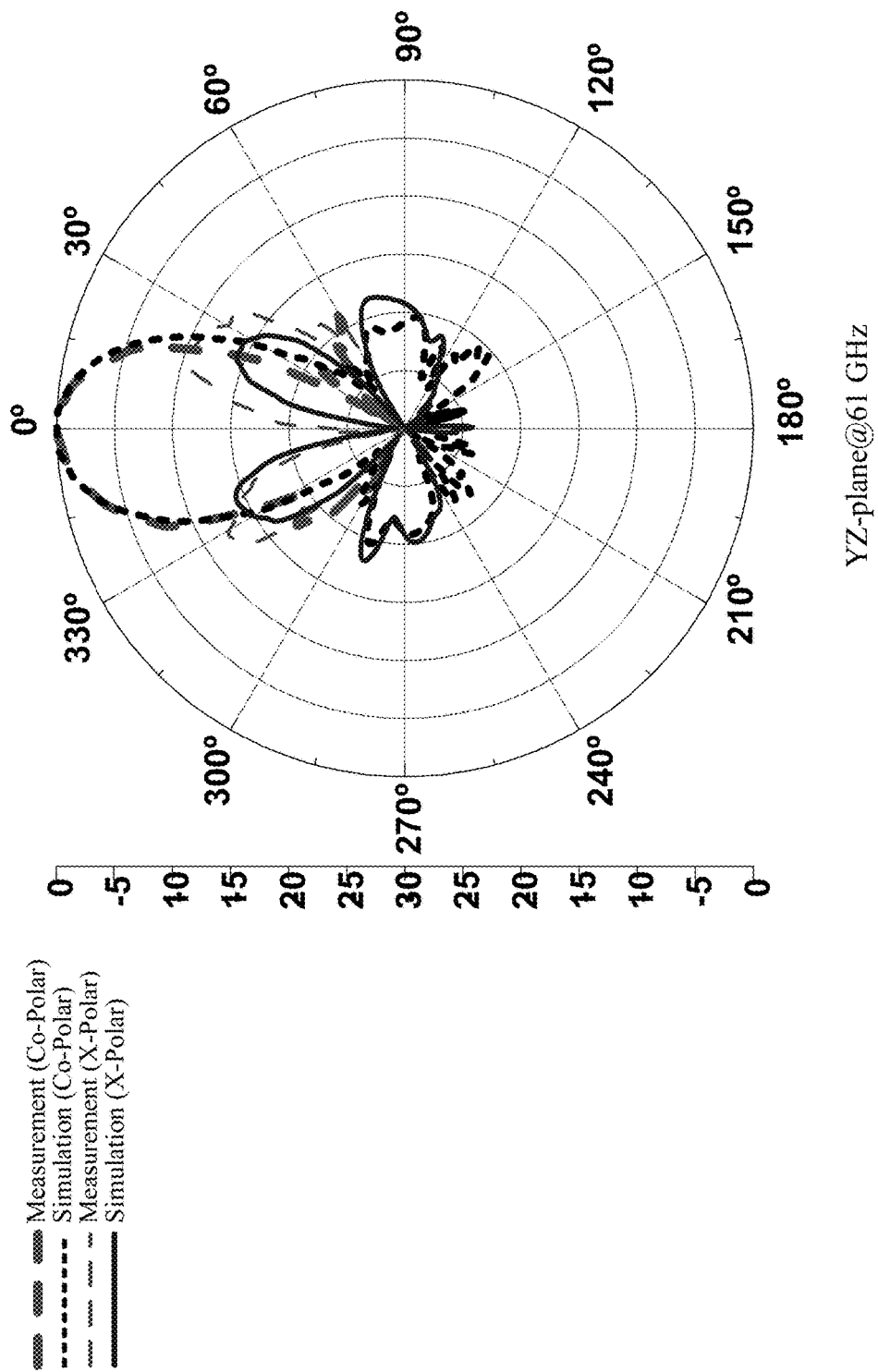
FIG. 12 illustrates measured and simulated radiation patterns an exemplary antenna at YZ-plane at 61 GHz, in accordance with various embodiments.
Figure 13:
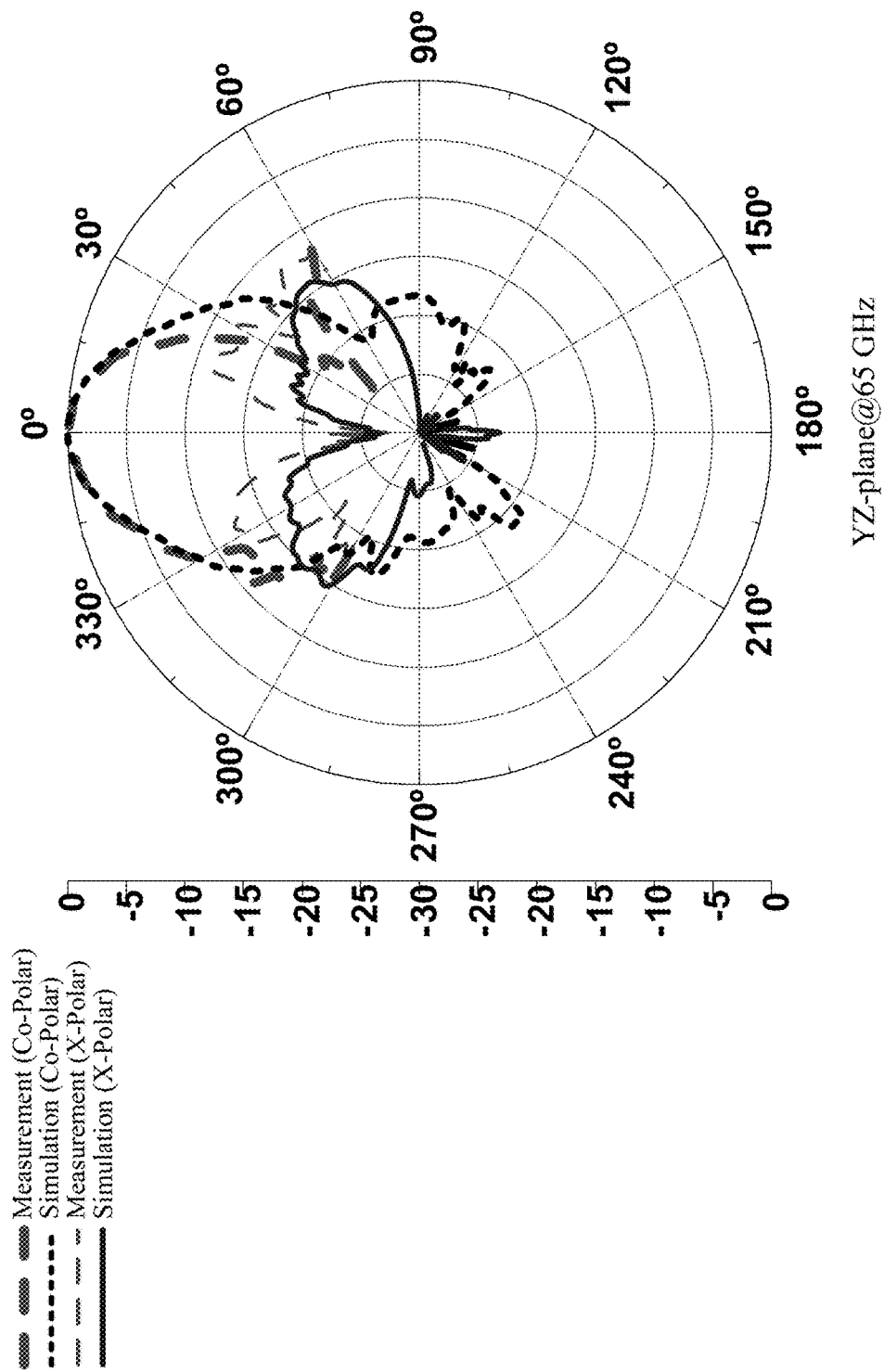
FIG. 13 illustrates measured and simulated radiation patterns an exemplary antenna at YZ-plane at 65 GHz, in accordance with various embodiments.

Referring to FIG. 7, a graph is depicted of measured and simulated broadside CP gain (e.g. LHCP gain) of antenna 100 with and without the differential feeding network at the dimensions given for 60 GHz wavelength in table II. Antenna 100 integrated with the differential feeding network, shows measured and simulated 2-dB LHCP gain bandwidths that are both about 16.3% with frequency ranges (56.1-65.8 GHz) and (57.7-67.5 GHz), respectively. The graph shows a measured maximum LHCP gain is 13.4 dBi occurring at 60 GHz, whereas the simulated maximum gain is 13.7 dBi occurring at 61 GHz. Antenna 100 without the feeding network, shows a simulated 3-dB LHCP gain bandwidth that is 18% (56.3-67.4 GHz) and a 2-dB LHCP gain bandwidth that is 14.6% (57-66 GHz). The graph shows a simulated maximum LHCP gain is 14.2 dBi. Therefore, the measured and simulated gain results are in good agreement and since there will be no need for the use of differential feeding network in practical application, the actual gain of antenna 100 will be about 14.2 dBi. In addition, knowing the gain of the antenna without the differential feeding network and the area outlined by the opening cavity as the physical aperture of the antenna, the obtained aperture efficiency of the antenna will be 85% at 60 GHz.

FIGS. 8, 9, 10, 11, 12, and 13 depict measured and simulated radiation patterns on XZ-plane and YZ-plane at 58, 61 and 65 GHz, which are normalized by the peak gain on the corresponding plane. FIGS. 8 through 13 show good agreement of the radiation patterns between measurement and simulation for Co-Polar and X-Polar respectively. The radiation patterns on both planes are roughly symmetric with the main beam and highest gain fixed in the broadside direction. Cross polarization is the lowest at the +z-direction as expected and larger at lower elevation angles on both sides of the z-axis. Antenna 100 shows a very small back lobe with a front-to-back ratio larger than 22 dB in both planes at all three shown frequencies within the operating bandwidth. It is noted that radiation patterns at both planes are not perfectly identical, with the radiation patterns at XZ-plane generally having larger side lobes than side lobes at YZ-plane. This is due to the asymmetric overall structure of antenna 100 when fabricated that is integrated with the feeding lines at its sides situated only along the ZX-plane. Given there will be no need for the use of differential feeding network in practical application, the actual radiation pattern will be more symmetric.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. An antenna, comprising:
    a substrate comprising:
        a patch section, wherein the patch section is a crossed-patch having a first windmill shape, and opposite arms of the first windmill shape of the patch section are offset on different sides from a center line running through a center of the patch section in a first direction of the opposite arms of the first windmill shape of the patch section; and
        an opening cavity that surrounds portions of the patch section, wherein the opening cavity has a second windmill shape and comprises a metal material.

2. The antenna of claim 1, wherein the opening cavity comprises two cavity sections on opposite sides of the patch section that respectively surround a half of the patch section.

3. The antenna of claim 1, wherein the opening cavity is configured to generate circularly polarized radiation.

4. The antenna of claim 1, wherein the antenna is 180 degrees rotationally symmetric about a center of the antenna.

5. The antenna of claim 1, wherein the opening cavity operates as a physical aperture of the antenna through which energy is radiated.

6. The antenna of claim 5, wherein the patch section transmits the energy into and within the opening cavity.

7. The antenna of claim 1, wherein respective shapes and dimensions of the opening cavity and patch section are selected to tune an electric field distribution within the opening cavity.

8. The antenna of claim 1, wherein respective shapes and dimensions of the opening cavity and patch section are selected to tune an energy reflection at one or more interfaces of a wall of the opening cavity, the patch section, and a feedline to the patch section.

9. The antenna of claim 1, wherein the antenna has uniform electric field distribution in the opening cavity.

10. The antenna of claim 1, wherein the substrate further comprises two feed lines respectively conductively connected to the patch section at opposite sides of the patch section.

11. The antenna of claim 10, wherein the patch section is fed differentially via the two feed lines.

12. The antenna of claim 1, wherein the patch section comprises a grounded point at a center of the patch section.

13. The antenna of claim 1, wherein the opening cavity has a height substantially equal to a quarter wavelength of an operating frequency of the antenna.

14. The antenna of claim 1, wherein the opening cavity has a diameter larger than a wavelength of an operating frequency of the antenna.

15. The antenna of claim 1, wherein the substrate is a single layer laminate.

16. The antenna of claim 1, wherein opposite arms of the second windmill shape of the opening cavity are offset on different sides from the center line running through the center of the patch section in the direction of the opposite arms of the second windmill shape.

17. A system, comprising:
    an antenna comprising an opening cavity having a second windmill shape, and a crossed patch section having a first windmill shape, wherein the opening cavity comprises a metal material and the crossed patch section is within a boundary of the opening cavity, and opposite arms of the first windmill shape of the crossed patch section are offset on different sides from a center line running through a center of the crossed patch section in the direction of the opposite arms of the first windmill shape of the crossed patch section; and a grounded co-planar waveguide that is conductively coupled to the crossed patch section at opposite ends of the crossed patch section.

18. The system of claim 17, wherein the grounded co-planar waveguide is configured to differentially feed the crossed patch section.

19. The system of claim 17, wherein the opening cavity comprises:

a first cavity section surrounding a first half of the crossed patch section, wherein the first cavity section comprises a first set electrically conductive pins that are conductively coupled to each other; and a second cavity section surrounding a second half of the crossed patch section, wherein the second cavity section comprises a second set of electrically conductive pins that are conductively coupled to each other, and the second half is opposite the first half.

20. The system of claim 17, wherein opposite arms of the second windmill shape of the opening cavity are offset on different sides from the center line running through the center of the patch section in the direction of the opposite arms of the second windmill shape.

21. A device, comprising:

an antenna comprising an opening cavity having a second windmill shape, and a crossed patch section having a first windmill shape, wherein the opening cavity comprises a metal material and the crossed patch section is within a perimeter of the opening cavity, opposite arms of the first windmill shape of the crossed patch section are offset on different sides from a center line running along a center of the crossed patch section in the direction of the opposite arms of the first windmill shape of the crossed patch section, and opposite arms of the second windmill shape of the opening cavity are offset on different sides from the center line running along the center of the patch section in the direction of the opposite arms of the second windmill shape, and wherein the antenna is configured to generate circularly polarized radiation.

22. The antenna of claim 21, wherein the antenna is 180 degrees rotationally symmetric about a geometric center of the antenna.

23. The antenna of claim 21, wherein the opening cavity comprises two cavity sections on opposite sides of the crossed-patch section that respectively surround a half of the crossed-patch section.

* * * * *